United States Patent [19]
Tomita et al.

[11] Patent Number: 5,188,501
[45] Date of Patent: Feb. 23, 1993

[54] WAFER TRANSFER SYSTEM

[75] Inventors: Munenori Tomita; Junichiro Takei, both of Annaka, Japan

[73] Assignee: Shin-Etsu Handotai Co., Ltd., Tokyo, Japan

[21] Appl. No.: 692,289

[22] Filed: Apr. 26, 1991

[30] Foreign Application Priority Data

Apr. 27, 1990 [JP] Japan .................................. 2-110612

[51] Int. Cl.⁵ .............................................. B65H 3/22
[52] U.S. Cl. ................................. 414/416; 118/503; 118/728; 414/DIG. 7; 414/225
[58] Field of Search ............... 414/217, 225, 226, 416, 414/586, DIG. 7, 684.3; 118/503, 728, 500; 221/309; 269/900, 902; 108/55.3; 294/172; 206/44.12, 564, 804

[56] References Cited

U.S. PATENT DOCUMENTS

| | | | |
|---|---|---|---|
| 3,272,350 | 9/1966 | Pflaumer et al. | 294/15 X |
| 3,764,511 | 10/1973 | Glick et al. | 118/728 X |
| 4,132,311 | 1/1979 | Glinert | 206/564 X |
| 4,208,006 | 6/1980 | Bixler et al. | 206/564 X |
| 4,986,215 | 1/1991 | Yamada et al. | 118/728 |
| 5,052,560 | 10/1991 | Stringham | 206/564 |

FOREIGN PATENT DOCUMENTS

| | | | |
|---|---|---|---|
| 2415277 | 10/1975 | Fed. Rep. of Germany | 108/55.3 |
| 0222221 | 10/1986 | Japan | 118/728 |
| 0295839 | 12/1987 | Japan | 414/DIG. 7 |
| 0295840 | 12/1987 | Japan | 414/DIG. 7 |

OTHER PUBLICATIONS

"Article Handling Apparatus", Metreaud, IBM Technical Disclosure Bulletin, vol. 9 No. 5, pp. 548-549, Oct. 1966.

*Primary Examiner*—Michael S. Huppert
*Assistant Examiner*—James Keenan
*Attorney, Agent, or Firm*—Whitham & Marhoefer

[57] ABSTRACT

A wafer transfer system consisting of automatic robot claws and a susceptor having circularly bounded and round-bottomed concavities for receiving wafers, wherein the concavities of the susceptor are each provided with at least three trenches made across the circumference of each concavity and arranged equiangularly about the center of each concavity; that each trench is formed such that when a wafer is set in the concavity that portion of the edge of the wafer which is disposed in the trench defines under itself a space in communication with the rest of the space defined by the trench; and that the automatic claws each have as many nails as the number of the trenches of each concavity and are capable of opening and closing the nails which are designed to engage with the wafer in the concavity by inserting the nail tips into the respective space defined under the edge of the wafer.

11 Claims, 4 Drawing Sheets

WAFER TRANSFER SYSTEM

FIELD OF THE INVENTION

The present invention relates to a wafer transfer system for a vapor phase epitaxial growth apparatus. More particularly, the invention relates to a wafer transfer system consisting of a susceptor on which semiconductor wafers are mounted and automatic claws for picking the wafers from and setting them on the susceptor.

DESCRIPTION OF THE PRIOR ART

In a vapor phase epitaxial growth apparatus, wherein a film layer is grown over the surface of wafers in vapor phase, the wafers are mounted on a susceptor and heated by a high frequency induction heating.

FIG. 7 is a cross section of a part of a conventional susceptor 101, which is commonly made of carbon and usually coated with a silicon carbide (SiC) film. Carbon is used for it has high heat conductivity and resistance. In the top face of the susceptor 101 are formed concavities (recesses) 102, which are circular when seen from above, for receiving wafers W. As seen in the cross section, the profile of the bottom 102a of the concavity 102 is curved for the purpose of facilitating uniform heating of the wafer W.

It requires expertness to set wafers in the cavities of the susceptor and to remove therefrom the still hot wafers after a film layer is epitaxially grown on the surface of the wafers in vapor phase; therefore, it is desired that the total operation of the wafer conveyance is automated.

When the operation of conveying wafers to and from the susceptor is to be automated, a problem that has to be solved first is how to effect the automatic conveyance of fragile wafers with high precision and efficiency so that the wafers are safe from breakage. In the conventional automatic system, the fragile wafers were not safe from damage especially when they were removed from the susceptor.

The present invention was contrived in view of the above problems, and it is an object of the invention to provide a wafer transfer system consisting of a susceptor and an automatic claws for transferring wafers with high precision and efficiency so that the wafers are safe from breakage.

SUMMARY OF THE INVENTION

In order to attain the above-described objects, the inventors designed a novel wafer transfer system consisting of automatic robot claws and a susceptor having circularly bounded and round-bottomed concavities for receiving wafers, which system is characterized by that the concavities of the susceptor are each provided with at least three trenches made across the circumference of each concavity and arranged equiangularly about the center of each concavity; that each trench is formed such that when a wafer is set in the concavity that portion of the edge of the wafer which is disposed in the trench defines under itself a space in communication with the rest of the space defined by the trench; and that the automatic robot claws each have as many nails as the number of the trenches of each concavity and are capable of opening and closing the nails which are designed to engage with the wafer in the concavity by inserting the nail tips into the respective space defined under the edge of the wafer.

In a preferred embodiment of the invention, each trench is rectangular when seen from above with two sides of the rectangle being normal to that radius of the circular concavity which, if extended, passes the center of the rectangle, and when cut by a plane normal to the upper face of the susceptor and passing through the center of the concavity and the center of the rectangular trench, each trench has a sectional profile resembling the check mark " ".

More preferably, the trenches are formed such that the distance between an inner ridge corresponding to the left-end tip of the check mark and the bottom ditch of the trench corresponding to the bottom tip of the check mark projected on a horizontal line (hereinafter referred to as "a") is from 2.0 to 3.0 mm and the height of the same ridge measured from the bottom ditch (hereinafter referred to as "b") is from 0.1 to 0.3 mm.

EFFECTS

To remove a wafer from a concavity of the susceptor, one of the automatic robot claws is caused to open its nails and the nails are inserted into the respective space defined underneath the edge of the wafer; the nails are slightly closed simultaneously to thereby engage with and pick up the wafer in a manner such that the wafer receives equal pressure from each nail concurrently so that the wafer is not locally stressed, and retains its horizontal posture; the robot claw is caused to shift upward whereby the wafer is removed from the concavity of the susceptor. Thus, the wafer is safe from damage.

To set a wafer in a concavity of the susceptor, the above-described process is virtually reversed. Incidentally, according to the result of the tests, it was found that the operation of transferring the wafer to and from the concavity of the susceptor was the most smooth when the values of a and b are such that $2.0 \text{ mm} \leq a \leq 3.0 \text{ mm}$ and $0.1 \text{ mm} \leq b \leq 0.3 \text{ mm}$.

BRIEF DESCRIPTION OF DRAWINGS

How the foregoing objects and advantages are attained will appear more fully from the following description referring to the accompanying drawings, in which.

EMBODIMENT

An embodiment of the invention will be described with reference to the attached drawings.

First, the structure of a susceptor 1 according to the present invention will be described with reference to FIGS. 1 through 4. The susceptor 1 is a flat ring made of carbon, which has high conductivity and resistance, and, in this embodiment, the carbon susceptor 1 is coated with a silicon carbide film. In the top face of the susceptor 1 are formed twenty-five concavities 2, which are circular when seen from above, for receiving wafers.

Figure 1:
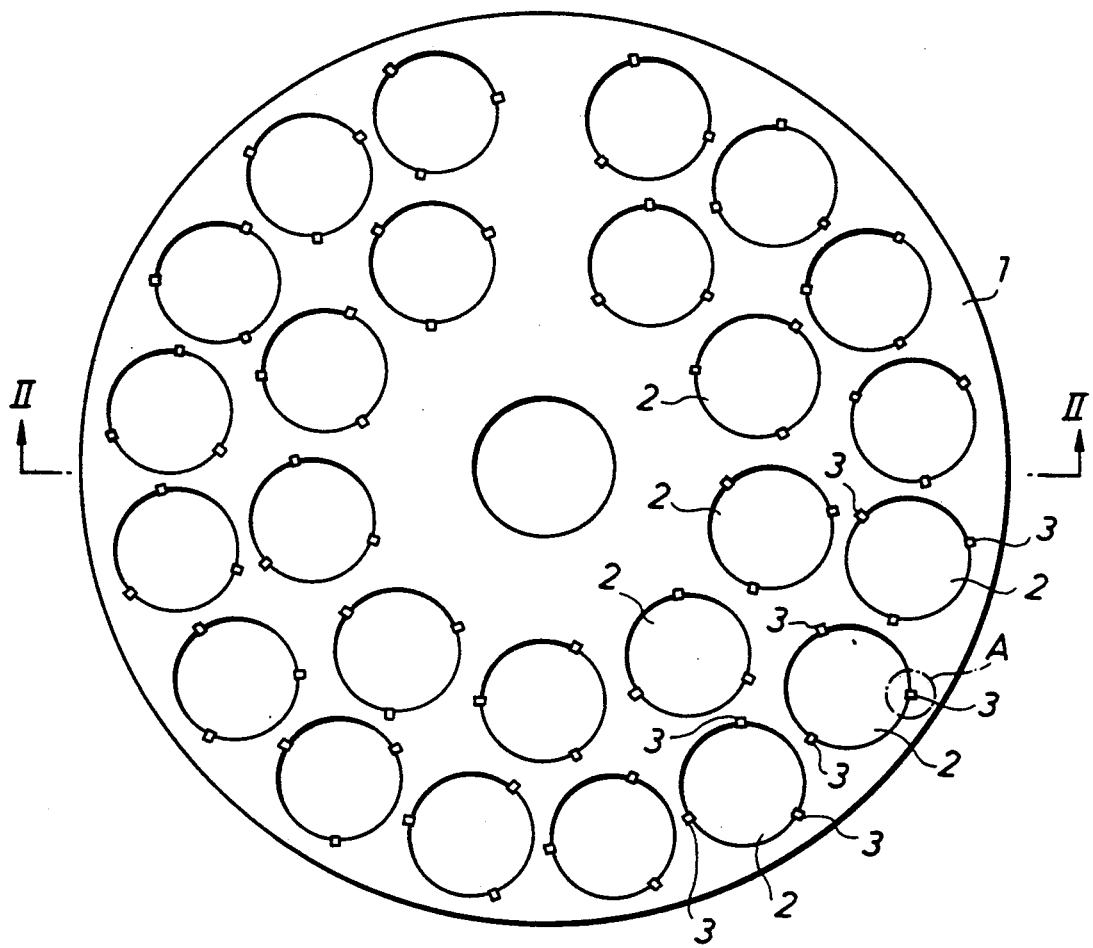
FIG. 1 is a top plan view of a susceptor according to the invention.
Figure 2:
FIG. 2 is a sectional view of the susceptor taken substantially along the line II—II of FIG. 1.
Figure 3:
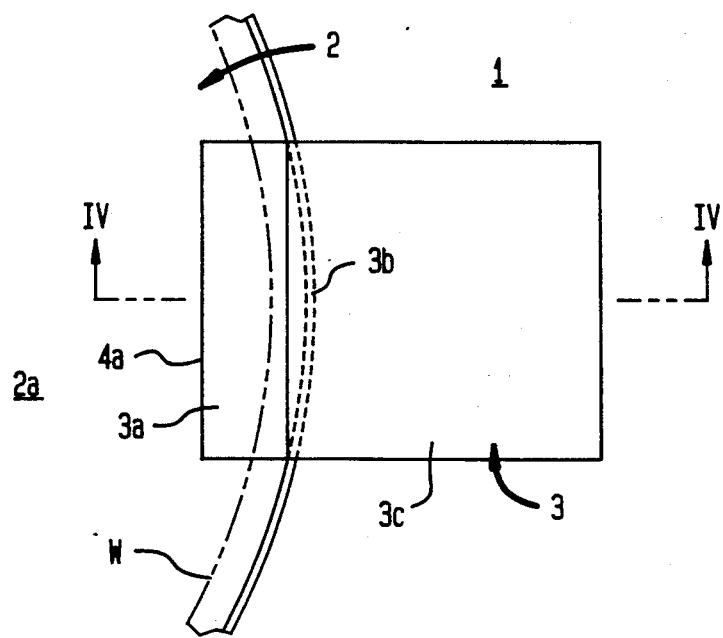
FIG. 3 is an enlarged view of the portion A of FIG. 1.
Figure 4:
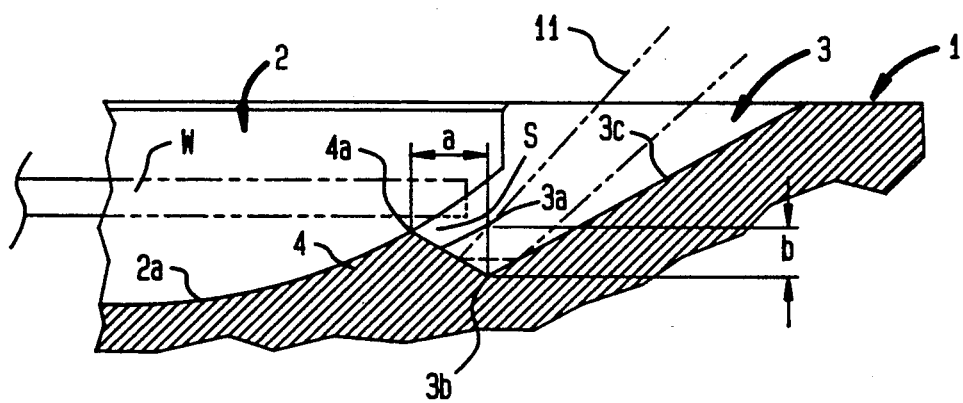
FIG. 4 is a sectional view taken along the line IV—IV of FIG. 3.

The concavities 2 have a diameter slightly greater than the diameter of the wafers, and a depth substantially greater than the thickness of the wafers. As shown in FIG. 4, the profile of the bottom 2a of each concavity 2 is curved, or more particularly, concave upward.

Three trenches 3, which are rectangular when seen from above, are formed across the circumference of each circular concavity 2. Each trench is oriented such that two of its sides are normal to that radius of the circular concavity 2 which, if extended, passes the center of the rectangular trench 3. The trenches 3 are arranged in a manner such that an angle of 120° is formed between the radii connecting the center of each rectangular trench 3 and the center of the concavity. When cut by a plane including the radius connecting the center of the concavity and the center of the rectangular trench and normal to the upper face of the susceptor, each trench has a sectional profile resembling the check mark " ", as shown in FIG. 4. In this profile of each trench 3, the shorter slope 3a forms a protrusion 4 in cooperation with the bottom 2a of the concavity 2, which 4 peaks at a ridge 4a in the bottom of the trench 3. Reference numeral 3c designates the longer slope of the trench 3.

Let the distance between the ridge 4a of the protrusion 4 and the bottom ditch 3b of the trench 3 projected on a horizontal line be a, and the height of the protrusion 4 from the bottom ditch 3b be b. In the present embodiment, a measures 2.0–3.0 mm, and b measures 0.1–0.3 mm.

In FIG. 4, a wafer W, drawn in two-dot chain line, is received in a concavity 2 of the susceptor 1. That portion of the edge of the wafer W which is in the trench 3 and extends beyond the ridge 4a of the protrusion 4 defines under itself a space S in cooperation with the slope 3a. This space S is in communication with the rest of the space defined by the trench, and large enough for the tip of a nail 11 of an automatic claw 10 (hereinafter described in detail) to enter.

Figure 5:
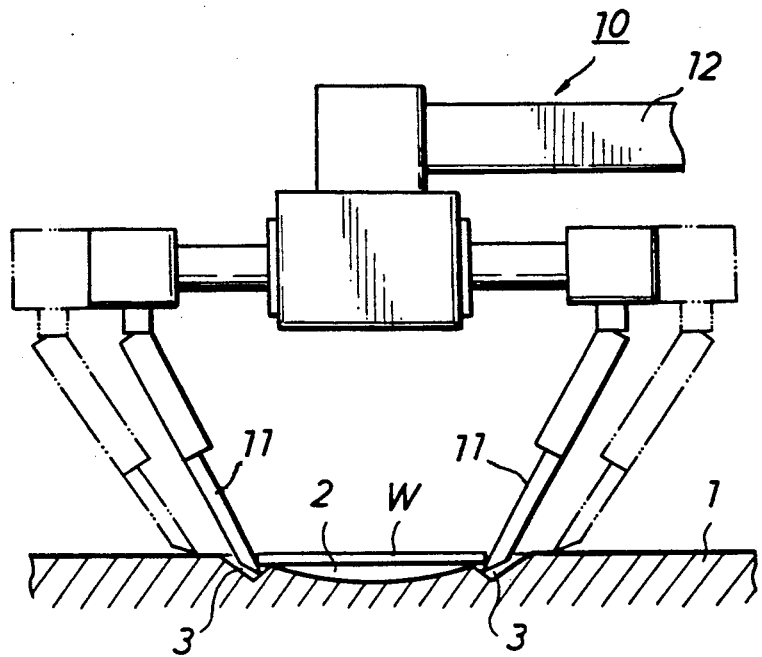
FIG. 5 is a view useful for explaining the operation of automatic claw according to the invention.

The automatic claw 10 according to the invention is basically a robot arm having three nails 11 supported by an arm rod 12. The nails 11 are capable of opening and closing, as shown in FIG. 5, where only two nails are shown for simplicity. The nails 11 are interlocked such that their movement is uniform and simultaneous; therefore, when one nail moves toward the center by a certain distance, the other two nails also move toward the center by the same distance in synchronism with the first nail. Furthermore, the nails 11 are arranged such that their tips can enter the space S under the wafer W when the nails are closed sufficiently.

Next, the operation of removing a wafer W from a concavity 2 of the susceptor 1 by means of the automatic claw will be described with reference to FIGS. 5 and 6.

At first, the nails 11 of the automatic claw 10 are in their open position and the tips of the nails are each positioned on the extension lines of the radii that connect the centers of respective rectangular trenches 3 and the center of the concavity 2.

As the nails 11 are caused to close, as drawn in solid line in FIG. 5, the tips of the nails 11 slide on the longer slopes 3c of the trenches 3, and eventually enter the space S defined underneath the edge of the wafer W, as drawn in two-dot chain line in FIG. 4.

Figure 6:
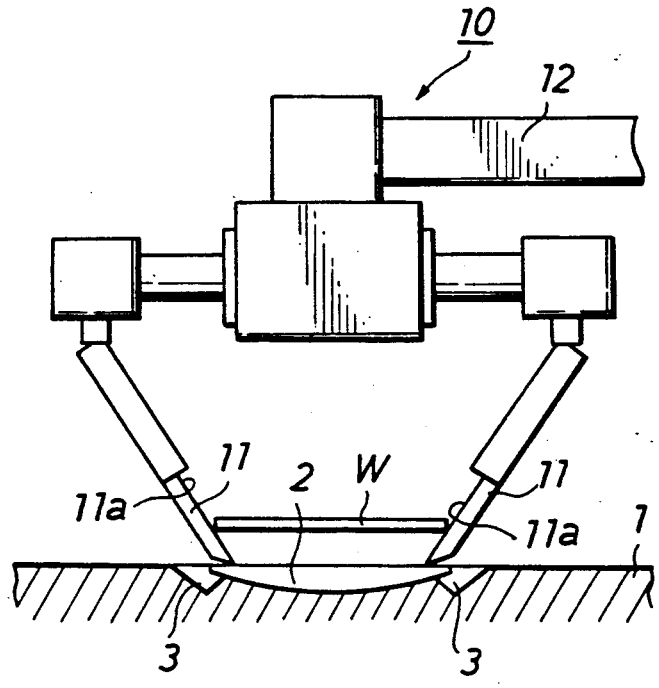
FIG. 6 is a view useful for explaining the operation of automatic claw according to the invention.
Figure 7:
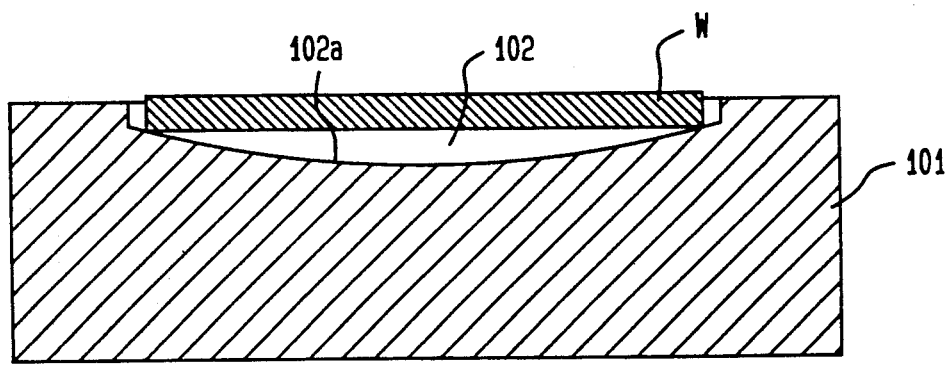
FIG. 7 is a cross section of a part of a conventional susceptor.

The nails 11 are closed further uniformly, whereupon the wafer W is scooped by them, as shown in FIG. 6. The periphery of the wafer W is supported on the slopes 11a provided by the nails 11, and the wafer W receives equal pressure from each nail 11 concurrently so that the wafer W is not locally stressed, and retains its horizontal posture. Thus, the fragile wafer W is safe from damage. Now, as the arm rod 12 is lifted up, the wafer W scooped by the nails 11 is removed clear from the susceptor 1. By virtue of the trenches 3, the movement of the nails 11 of the automatic claw can be simple; therefore, the efficiency of the wafer removal operation is increased.

A wafer W held by the nails 11 can be released and set in a concavity 2 safely and accurately by reversing the procedure of the wafer removal operation described above.

Now, the dimensions a and b of the trench 3 were altered variously, and the inventors have found that the wafer transfer operation was most smooth when a is from 2.0 to 3.0 mm, and b is from 0.1 to 0.3 mm, irrespective of the diameter of the wafer.

As is clear from the above description, according to the invention, a novel wafer transfer system consisting of automatic robot claws and a susceptor having circularly bounded and round-bottomed concavities for receiving wafers, is characterized by that the concavities of the susceptor are each provided with at least three trenches made across the circumference of each concavity and arranged equiangularly about the center of each concavity, that each trench is formed such that when a wafer is set in the concavity that portion of the edge of the wafer which is disposed in the trench defines under itself a space in communication with the rest of the space defined by the trench; and that the automatic robot claws each have as many nails as the number of the trenches of each concavity and are capable of opening and closing the nails which are designed to engage with the wafer in the concavity by inserting the nail tips into the respective space defined under the edge of the wafer; so that the wafer can be removed from and set in the concavity safely and effectively.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. In a wafer transfer system including automatic robot claws and a susceptor having circularly bounded and round-bottomed concavities for receiving wafers, an improvement comprising at least three trenches made across the circumference of each concavity and arranged equiangularly about the center of each concavity; each trench being formed such that, when a wafer is set in the concavity, that portion of the edge of the wafer which is disposed in the trench defines under itself a space in communication with the portion of the space defined by the trench which is outside the circumference of the wafer; and said automatic robot claws each having as many nails as the number of the trenches of each concavity and capable of opening and closing the nails which are designed to engage with the wafer in the concavity by inserting the nail tips into the respective space defined under the edge of the wafer.

2. The wafer transfer system as claimed in claim 1 wherein each of said trenches is rectangular when seen from above with two sides of the rectangle being normal to that radius of said circular concavity which, if extended, passes the center of the rectangle, and when cut by a plane normal to the upper face of the susceptor and including said radius, each trench has a sectional profile resembling the check mark * *.

3. The wafer transfer system as claimed in claim 2 wherein the trenches are formed such that the distance between an inner ridge corresponding to the left-end tip of the check mark and the bottom ditch of the trench corresponding to the bottom tip of the check mark projected on a horizontal line is from 2.0 to 3.0 mm and the height of the same ridge measured from the bottom ditch is from 0.1 to 0.3 mm.

4. A wafer transfer system including automatic robot claws and a susceptor having circularly bounded and round-bottomed concavities for receiving wafers wherein said concavities of said susceptor are each provided with at least three trenches made across the circumference of each concavity and arranged equiangularly about the center of each concavity; each trench being formed to define a space, under an edge of a wafer and in communication with the portion of the space defined by the trench which is outside the circumference of the wafer when a wafer is set in the concavity, for entry of a nail of said automatic robot claw.

5. A wafer transfer system as recited in claim 4, wherein said automatic robot claws each have as many nails as the number of the trenches of each concavity and are capable of opening and closing the nails.

6. A wafer transfer system as recited in claim 5, wherein said nails of said robot claws each include a tip for engaging with the wafer in the concavity by inserting the nail tips into the respective space defined under an edge of the wafer.

7. The wafer transfer system as claimed in claim 4 wherein each of said trenches is rectangular when seen from above with two sides of the rectangle being normal to a radius of said circular concavity which, if extended, passes the center of the rectangle, and when cut by a plane normal to the upper face of the susceptor and including said radius, each trench has a sectional profile resembling a check mark, * *.

8. The wafer transfer system as claimed in claim 7 wherein the trenches are formed such that the distance between an inner ridge corresponding to the left-end tip of the check mark and the bottom ditch of the trench corresponding to the bottom tip of the check mark projected on a horizontal line is from 2.0 to 3.0 mm and the height of the same ridge measured from the bottom ditch is from 0.1 to 0.3 mm.

9. A susceptor for a wafer transfer system having circularly bounded and round-bottomed concavities for receiving wafers, at least one of said concavities of the susceptor being provided with at least three trenches made across the circumference of said at least one of said concavities and arranged equiangularly about the center of each concavity, each said trench being formed to define a space, under an edge of a wafer and in communication with the portion of the space defined by the trench which is outside the circumference of the wafer when a wafer is set in the concavity.

10. The susceptor as claimed in claim 9 wherein each of said trenches is rectangular when seen from above with two sides of the rectangle being normal to a radius of said circular concavity which, if extended, passes the center of the rectangle, and when cut by a plane normal to the upper face of the susceptor and including said radius, each trench has a sectional profile resembling a check mark, * *.

11. The susceptor as claimed in claim 10 wherein the trenches are formed such that the distance between an inner ridge corresponding to the left-end tip of the check mark and the bottom ditch of the trench corresponding to the bottom tip of the check mark projected on a horizontal line is from 2.0 to 3.0 mm and the height of the same ridge measured from the bottom ditch is from 0.1 to 0.3 mm.

* * * * *